United States Patent
Jeong et al.

(10) Patent No.: US 9,628,034 B2
(45) Date of Patent: Apr. 18, 2017

(54) OPERATIONAL AMPLIFYING CIRCUIT AND SEMICONDUCTOR DEVICE COMPRISING THE SAME

(71) Applicant: SAMSUNG ELECTRONICS CO., LTD., Suwon-si (KR)

(72) Inventors: Ji-Yong Jeong, Seoul (KR); Jin-Soo Kim, Seoul (KR); Seung-Hwan Baek, Hwaseong-si (KR); Ha-Joon Shin, Anyang-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 14/798,675

(22) Filed: Jul. 14, 2015

(65) Prior Publication Data

US 2016/0072446 A1 Mar. 10, 2016

(30) Foreign Application Priority Data

Sep. 5, 2014 (KR) .................. 10-2014-0119300

(51) Int. Cl.
*H03F 3/45* (2006.01)
*H03F 3/30* (2006.01)

(52) U.S. Cl.
CPC ......... *H03F 3/303* (2013.01); *H03F 3/45219* (2013.01); *G09G 2310/0291* (2013.01); *G09G 2320/0252* (2013.01); *G09G 2330/021* (2013.01); *H03F 2203/30015* (2013.01); *H03F 2203/30021* (2013.01); *H03F 2203/45112* (2013.01); *H03F 2203/45116* (2013.01); *H03F 2203/45244* (2013.01); *H03F 2203/45274* (2013.01); *H03F 2203/45512* (2013.01)

(58) Field of Classification Search
CPC ...................................................... H03F 3/303
USPC .................................................. 330/253, 257
See application file for complete search history.

(56) References Cited

U.S. PATENT DOCUMENTS

| | | |
|---|---|---|
| 5,442,320 A | 8/1995 | Kunst et al. |
| 6,204,654 B1 | 3/2001 | Miranda et al. |
| 6,265,921 B1 | 7/2001 | Heinrich |
| 6,529,048 B2 | 3/2003 | Zanchi |
| 6,624,696 B1 | 9/2003 | Eschauzier et al. |
| 7,482,845 B2 | 1/2009 | Lee et al. |
| 7,652,538 B2 | 1/2010 | Choi |
| 7,795,976 B2 | 9/2010 | Wong et al. |

(Continued)

*Primary Examiner* — Khanh V Nguyen
*Assistant Examiner* — Khiem Nguyen
(74) *Attorney, Agent, or Firm* — Sughrue Mion, PLLC

(57) ABSTRACT

An operational amplifying circuit are provided. The operational amplifying circuit includes a control circuit, pull-up and pull-down transistors, first and second bias circuits, and a bias voltage generating circuit. The control circuit includes first and second input terminals, and is configured to change, when an input voltage transitions to a first level, a voltage level of a pull-up node and a pull-down node to a second level different from the first level. The pull-up transistor provides a power supply voltage to the output terminal. The pull-down transistor connects the output terminal to a ground voltage. The first bias circuit provides a first bias current to the control circuit. The bias voltage generating circuit generates a bias voltage when the voltage level of at least one of the pull-up and pull-down nodes reaches a threshold voltage level, and the second bias circuit provides a second bias current to the control circuit.

20 Claims, 15 Drawing Sheets

(56) References Cited

U.S. PATENT DOCUMENTS

| | | |
|---|---|---|
| 7,855,600 B2 | 12/2010 | An et al. |
| 8,044,950 B2 | 10/2011 | Satou |
| 8,222,957 B2 | 7/2012 | Kato |
| 8,237,693 B2 | 8/2012 | Nishimura et al. |
| 8,427,236 B2 | 4/2013 | Nishimura |
| 8,466,909 B2 | 6/2013 | An et al. |
| 2008/0309410 A1* | 12/2008 | Ogawa .................. H03F 3/3022 330/253 |
| 2013/0249635 A1 | 9/2013 | Kim et al. |

* cited by examiner

1000

1100

OPERATIONAL AMPLIFYING CIRCUIT AND SEMICONDUCTOR DEVICE COMPRISING THE SAME

CROSS-REFERENCE TO RELATED APPLICATION

This application claims priority from Korean Patent Application No. 10-2014-0119300 filed on Sep. 5, 2014 in the Korean Intellectual Property Office, the contents of which are herein incorporated by reference in their entirety.

BACKGROUND

1. Technical Field

The present disclosure relates to an operational amplifying circuit and a semiconductor device comprising the same.

2. Description of the Related Art

Along with an increase in size of a display panel, many changes are required in a display driving IC (DDI) for driving a large-sized panel.

For example, in order to stably drive the large-sized panel, the DDI is required to have low power consumption with a high slew rate.

SUMMARY

One or more exemplary embodiments provide an operational amplifying circuit having low power consumption with a high slew rate.

One or more exemplary embodiments also provide a semiconductor device with improved operational reliability.

According to an aspect of an exemplary embodiment, there is provided an operational amplifying circuit including: a control circuit including a first input terminal configured to receive an input voltage, a second input terminal and an output terminal connected to the second input terminal, the control circuit being configured to, in response to the input voltage transitioning to a first level, change a voltage level of a pull-up node and a voltage level of a pull-down node to a second level that is different from the first level; a pull-up transistor gated to the voltage level of the pull-up node to provide a power supply voltage to the output terminal; a pull-down transistor gated to the voltage level of the pull-down node to connect the output terminal to a ground voltage; a first bias circuit configured to provide a first bias current to the control circuit; a bias voltage generating circuit configured to generate a bias voltage in response to the voltage level of at least one of the pull-up node and the pull-down node reaching a threshold voltage level; and a second bias circuit gated to the generated bias voltage to provide a second bias current to the control circuit.

According to an aspect of another exemplary embodiment, there is provided an operational amplifying circuit including a control circuit including a first input terminal configured to receive an input voltage, a second input terminal and an output terminal connected to the second input terminal, the control circuit being configured to, in response to the input voltage transitioning to a first level, change a voltage level of a pull-up node and a voltage level of a pull-down node to a second level that is different from the first level; a pull-up transistor gated to the voltage level of the pull-up node to provide a power supply voltage to the output terminal; a pull-down transistor gated to the voltage level of the pull-down node to connect the output terminal to a ground voltage; a first bias circuit configured to provide a first bias current to the control circuit; and a second bias circuit configured to generate a first bias voltage and a second bias voltage which are different from each other, in response to the voltage level of at least one of the pull-up node and the pull-down node reaching a threshold voltage level, and to provide a second bias current to the control circuit.

According to an aspect of another exemplary embodiment, there is provided a semiconductor device that includes a digital-to-analog converter to convert a digital signal into an analog signal, and an operational amplifying circuit configured to receive an output of the digital-to-analog converter and provide the output to a source line, wherein the operational amplifying circuit includes: a control circuit including a first input terminal to which the output of the digital-to-analog converter is provided and a second input terminal connected to the source line, and configured to change, in response to the output of the digital-to-analog converter transitioning to a first level, a voltage level of a pull-up node and a voltage level of a pull-down node to a second level that is different from the first level, a pull-up transistor gated to the voltage level of the pull-up node to provide a power supply voltage to the source line, a pull-down transistor gated to the voltage level of the pull-down node to connect the source line to a ground voltage, a first bias circuit configured to provide a first bias current to the control circuit, a bias voltage generating circuit configured to generate a bias voltage in response to the voltage level of at least one of the pull-up node and the pull-down node reaching a threshold voltage level, and a second bias circuit gated to the generated bias voltage to provide a second bias current to the control circuit.

According to an aspect of another exemplary embodiment, there is provided an operational amplifying circuit including a first input terminal; an output terminal; a second input terminal electrically connected to the output terminal; an amplification circuit that is electrically connected to the first input terminal, the second input terminal, and the output terminal, the amplification circuit including a node and configured to amplify an input signal input at the first input terminal and output the amplified signal at the output terminal; a first bias circuit configured to provide a first bias current for driving the amplification circuit; and a second bias circuit configured to receive the first bias current and generate a second bias current for driving the amplification circuit in response to a voltage level at the node crossing a threshold voltage level.

BRIEF DESCRIPTION OF THE DRAWINGS

The above and/or other aspects will become more apparent by describing in detail exemplary embodiments with reference to the attached drawings, in which.

DETAILED DESCRIPTION OF EXEMPLARY EMBODIMENTS

Figure 1:
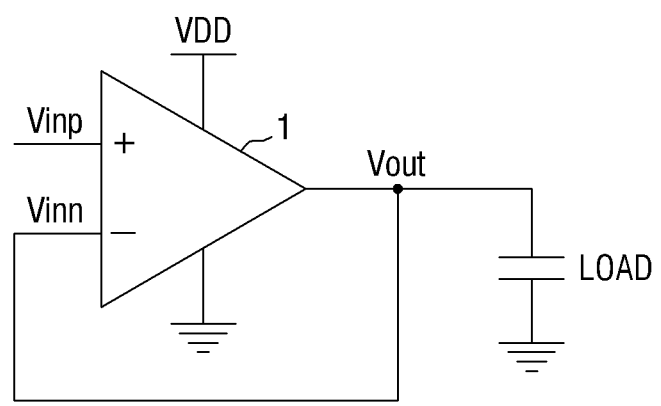
FIG. 1 is a circuit diagram of an operational amplifying circuit according to an exemplary embodiment.

Advantages and features of the exemplary embodiments may be understood with the following detailed description of the exemplary embodiments and the accompanying drawings. The present inventive concept may, however, be embodied in many different forms and should not be construed as being limited to the exemplary embodiments set forth herein. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms "first", "second", etc. may be used herein to describe various elements, these elements should not be limited by these terms. These terms are only used to distinguish one element from another element. Thus, for example, a "first" element, a "first" component or a "first" section discussed below could be termed a "second" element, a "second" component or a "second" section without departing from the teachings of the present inventive concept.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

An operational amplifying circuit according to an exemplary embodiment will be described with reference to FIGS. 1 and 2.

FIG. 1 is a circuit diagram of an operational amplifying circuit according to an exemplary embodiment. FIG. 2 is a detailed circuit diagram of the operational amplifying circuit of FIG. 1.

Referring to FIG. 1, an output terminal Vout of an operational amplifying circuit 1 may be connected to a load. In some exemplary embodiments, the load may be, for example, pixels constituting a display panel. However, the inventive concept is not limited thereto.

The output terminal Vout of the operational amplifying circuit 1 may be connected to a second input terminal Vinn. In other words, an output provided to the output terminal Vout of the operational amplifying circuit 1 may be provided to the second input terminal Vinn through a feedback loop.

Figure 2:
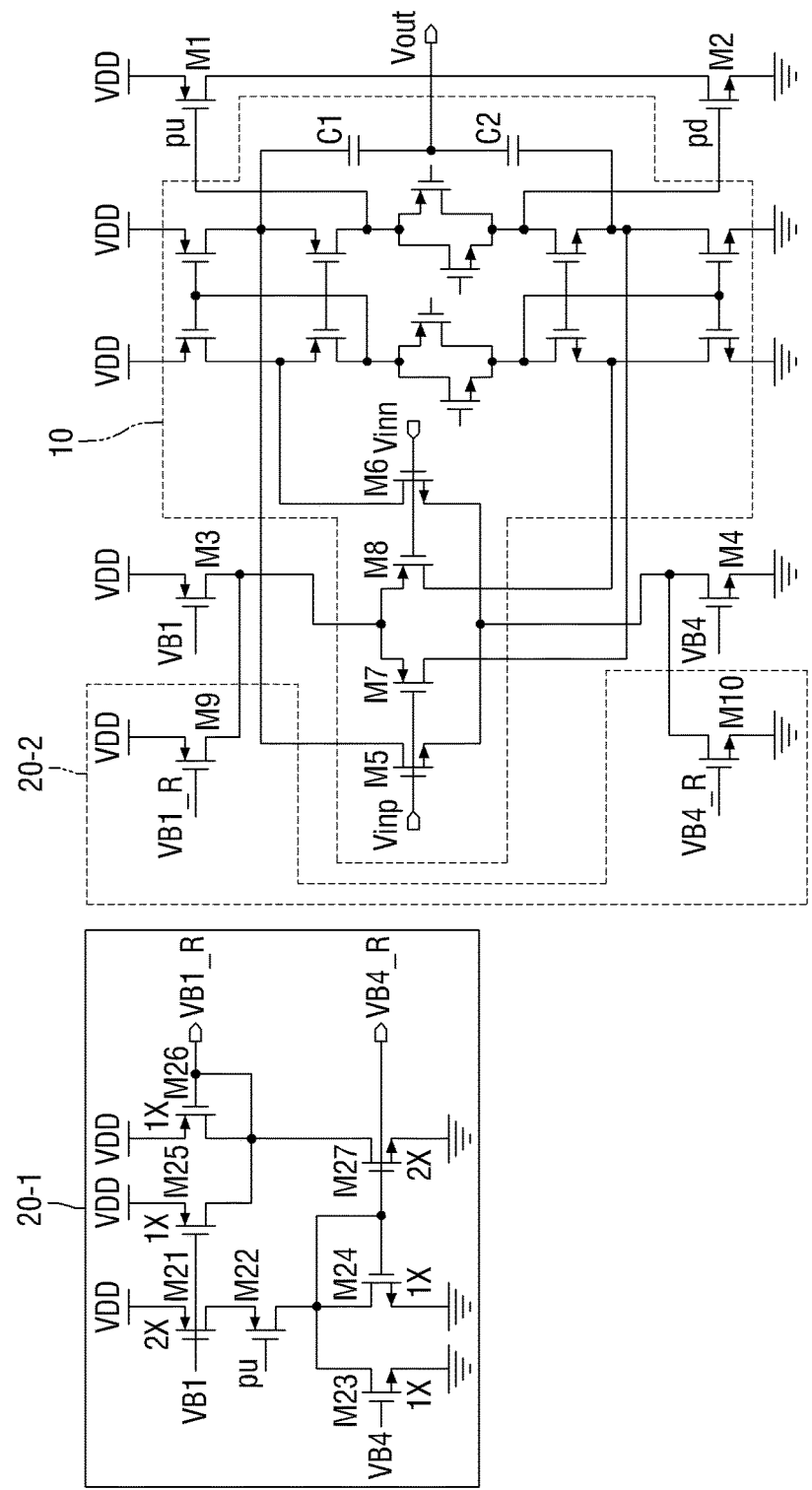
FIG. 2 is a detailed circuit diagram of the operational amplifying circuit of FIG. 1.

Referring to FIG. 2, the operational amplifying circuit 1 may include a control circuit 10, a pull-up transistor M1, a pull-down transistor M2, a first bias circuit M3 and M4, a bias voltage generating circuit 20-1, and a second bias circuit 20-2. The control circuit may be an amplification circuit.

When an input voltage applied to a first input terminal Vinp (see also FIG. 1) transitions to a first level (e.g., logical high level, hereinafter referred to as H), the control circuit 10 may change a voltage level of a pull-up node pu and a voltage level of a pull-down node pd to a second level (e.g., logical low level, hereinafter referred to as L).

The control circuit 10 may include transistors M5 and M7 gated to the input voltage applied to the first input terminal Vinp, transistors M6 and M8 gated to the input voltage applied to the second input terminal Vinn, a plurality of transistors T used to change the voltage levels of the pull-up node pu and the pull-down node pd to the second level L on the basis of the input voltage applied to the first input terminal Vinp, and a plurality of capacitors C1 and C2 connected to the output terminal Vout. That is, the gate terminals of the transistors M5 and M7 may be electrically connected to the first input terminal Vinp, and the gate terminals of the transistors M6 and M8 may be electrically connected to the second input terminal Vinn.

The pull-up transistor M1 may be gated to the voltage level of the pull-up node pu to provide a power supply voltage VDD to the output terminal Vout. In some exemplary embodiments, the pull-up transistor M1 may include, e.g., a PMOS transistor, but the inventive concept is not limited thereto.

The pull-down transistor M2 may be gated to the voltage level of the pull-down node pd to connect a ground voltage to the output terminal Vout. In some exemplary embodiments, the pull-down transistor M2 may include, e.g., an NMOS transistor, but the inventive concept is not limited thereto.

The first bias circuit M3 and M4 may provide a bias current for driving the control circuit 10. The first bias circuit M3 and M4 may include a transistor M3 which is gated to a first control voltage VB1 to provide the power supply voltage VDD to the control circuit 10, and a transistor M4 which is gated to a second control voltage VB4 to connect the ground voltage to the control circuit 10.

Specifically, a drain of the transistor M3 may be connected to sources of the transistors M7 and M8 of the control circuit 10, and a drain of the transistor M4 may be connected to sources of the transistors M5 and M6 of the control circuit 10.

In some exemplary embodiments, the transistors M3, M7 and M8 may include, e.g., PMOS transistors, and the transistors M4, M5 and M6 may include, e.g., NMOS transistors, but the inventive concept is not limited thereto.

The bias voltage generating circuit 20-1 may generate a first bias voltage VB1_R and a second bias voltage VB4_R which are different from each other. The bias voltage generating circuit 20-1 may generate the first and second bias voltages VB1_R and VB4_R when the voltage level of the pull-up node pu reaches a threshold voltage level (e.g., SDL of FIG. 3). For example, the bias voltage generating circuit 20-1 may generate the first and second bias voltages VB1_R and VB4_R when the voltage level of the pull-up node pu is less than or equal to the threshold voltage level.

The bias voltage generating circuit 20-1 may include a transistor M22 which is gated to the voltage level of the pull-up node pu and turned on when the voltage level of the pull-up node pu reaches a threshold voltage level (e.g., SDL of FIG. 3), a transistor M21 which is gated to the first control voltage VB1 to provide the power supply voltage VDD to the transistor M22, and a transistor M23 which is gated to the second control voltage VB4 to connect the transistor M22 to the ground voltage. The threshold voltage level may be predetermined.

Further, the bias voltage generating circuit 20-1 may include a transistor M24 which is gated to the second bias voltage VB4_R to connect the transistor M22 to the ground voltage, a transistor M25 which is gated to the first control voltage VB1 to generate a bias current, a transistor M26 which is gated to the first bias voltage VB1_R to provide the power supply voltage VDD to a transistor M27, and the transistor M27 which is gated to the second bias voltage VB4_R to connect the transistor M25 to the ground voltage.

In some exemplary embodiments, the size (for example, measured in nanometers (nm)) of the transistors M21 and M27 may be different from the size of the transistors M23 to M26. Specifically, the size of the transistors M21 and M27 may be greater than the size of the transistors M23 to M26. More specifically, the size of the transistors M21 and M27 may be twice the size of the transistors M23 to M26.

In some exemplary embodiments, the transistors M21, M22, M25 and M26 may include, e.g., PMOS transistors, and the transistors M23, M24 and M27 may include, e.g., NMOS transistors, but the inventive concept is not limited thereto.

The second bias circuit 20-2 may receive the first and second bias voltages VB1_R and VB4_R generated from the bias voltage generating circuit 20-1 and provide a second bias current to the control circuit 10.

In some exemplary embodiments, the amplitude of the second bias current provided to the control circuit 10 from the second bias circuit 20-2 may be smaller than the amplitude of a first bias current provided to the control circuit 10 from the first bias circuit M3 and M4. However, the inventive concept is not limited thereto, and modifications may be made.

The second bias circuit 20-2 may include a transistor M9 which is gated to the first bias voltage VB1_R to provide the power supply voltage VDD to the control circuit 10, and a transistor M10 which is gated to the second bias voltage VB4_R to connect the ground voltage to the control circuit 10.

Specifically, a drain of the transistor M9 may be connected to the drain of the transistor M3 and the sources of the transistors M7 and M8 of the control circuit 10, and a drain of the transistor M10 may be connected to the drain of the transistor M4 and the sources of the transistors M5 and M6 of the control circuit 10.

In some exemplary embodiments, the transistor M9 may include, e.g., a PMOS transistor, and the transistor M10 may include, e.g., an NMOS transistor, but the inventive concept is not limited thereto.

Hereinafter, an operation of the operational amplifying circuit according to an exemplary embodiment will be described with reference to FIGS. 1 to 5.

Figure 3:
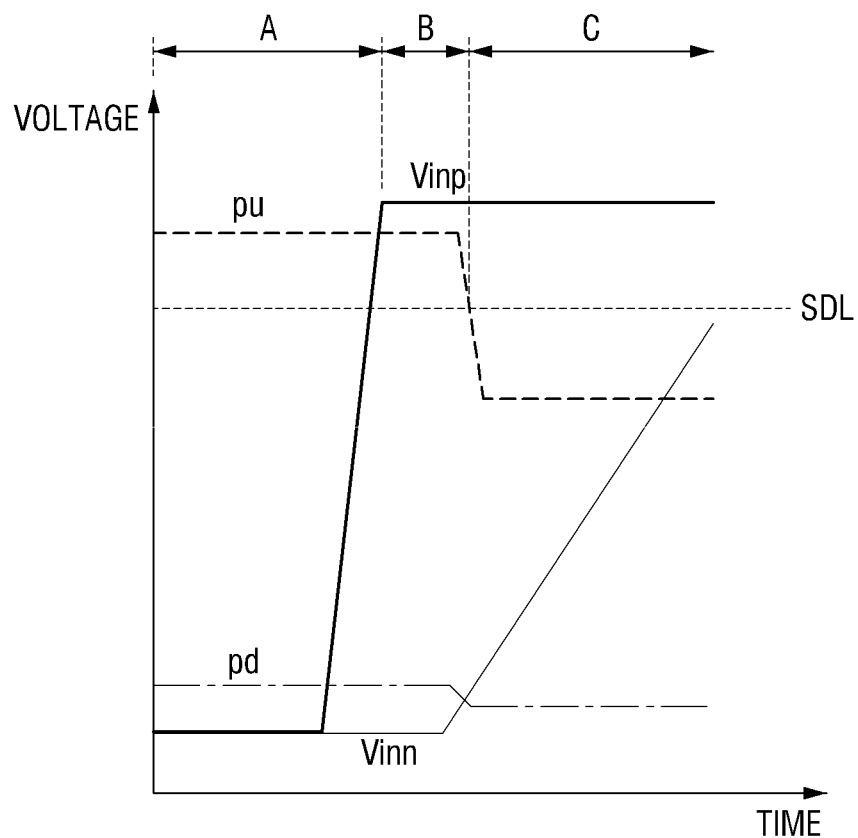
FIG. 3 is an operation diagram of the operational amplifying circuit of FIG. 1.
Figure 4:
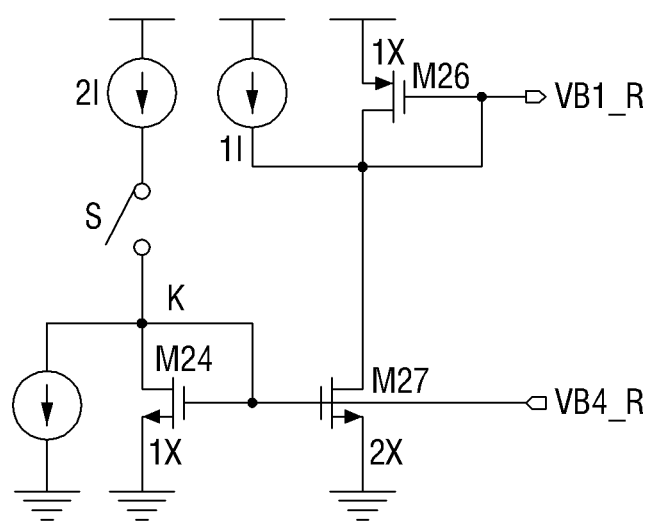
FIGS. 4 and 5 are diagrams for explaining an operation of the operational amplifying circuit of FIG. 1.
Figure 5:
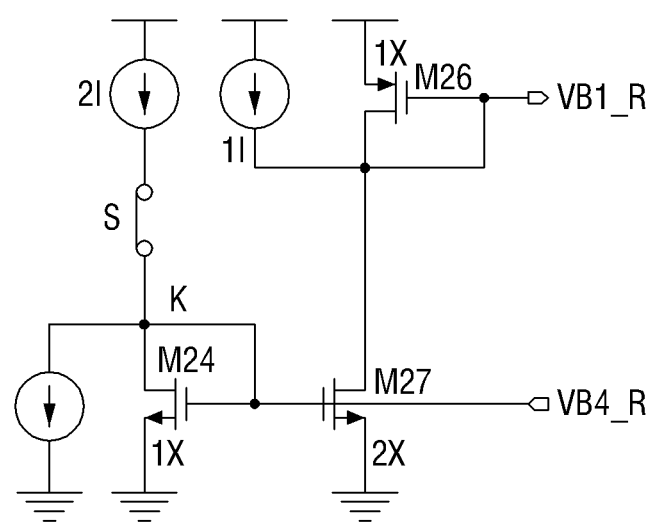

FIG. 3 is an operation diagram of the operational amplifying circuit of FIG. 1. FIGS. 4 and 5 are diagrams for explaining an operation of the operational amplifying circuit of FIG. 1.

Referring to FIG. 3, the input voltage inputted to the first input terminal Vinp transitions to the first level H (section A). Accordingly, the transistor M5 is turned on and the transistor M7 is turned off. On the other hand, since the level of the input voltage inputted to the first input terminal Vinp has not been delivered to the output terminal Vout, the second input terminal Vinn is maintained at the second level L. Accordingly, the transistor M8 is turned on, and the transistor M6 is turned off.

Then, according to the operation of the control circuit 10, the voltage of the pull-up node pu transitions from the first level H to the second level L (section B).

Since it can be easily inferred by those skilled in the art that the voltage of the pull-up node pu transitions from the first level H to the second level L according to the operation of the control circuit 10, a detailed description thereof will be omitted.

If the voltage level of the pull-up node pu is lowered, but the voltage level does not reach the threshold voltage level SDL, the transistor M22 included in the bias voltage generating circuit 20-1 is not turned on. Thus, the bias voltage generating circuit 20-1 is also operated in a state shown in FIG. 4. The threshold voltage level SDL may be predetermined.

That is, since a switch corresponding to the transistor M22 is open, the voltage level of a node K in FIG. 4 is maintained at the second level L. Accordingly, the voltage level of the second bias voltage VB4_R is maintained at the second level L. Since the transistor M27 gated to the second bias voltage VB4_R is turned off, the voltage level of the first bias voltage VB1_R is maintained at the first level H.

Thus, both the transistors M9 and M10 included in the second bias circuit 20-2 are maintained in the turn-off state.

Then, according to the operation of the control circuit 10, the voltage of the pull-up node pu transitions to a level equal to or less than the threshold voltage level SDL (section C in FIG. 3). The threshold voltage level SDL may be predetermined.

Accordingly, the transistor M22 included in the bias voltage generating circuit 20-1 is turned on. Thus, the bias voltage generating circuit 20-1 is operated in a state shown in FIG. 5.

Now, since a switch corresponding to the transistor M22 is closed, the voltage of the node K in FIG. 5 transitions to the first level H. Accordingly, the second bias voltage VB4_R also transitions to the first level H. Since the transistor M27 gated to the second bias voltage VB4_R is turned on, the first bias voltage VB1_R transitions to the second level L.

Accordingly, both the transistors M9 and M10 included in the second bias circuit 20-2 are turned on, and the second bias current is provided to the control circuit 10.

In the operational amplifying circuit 1, in order to increase a slew rate, it is advantageous to increase the bias current provided to the control circuit 10, or to decrease the capacitance of the capacitors C1 and C2.

In the case of increasing the bias current provided to the control circuit 10, there is a disadvantage that power consumption increases. In the case of decreasing the capacitance of the capacitors C1 and C2, there is a disadvantage that the output provided to the output terminal Vout becomes uneven.

However, in the operational amplifying circuit 1 according to the exemplary embodiment, an additional bias current is provided to the control circuit 10 by detecting a time point when the voltage level of the pull-up node pu becomes equal to or less than a threshold level without decreasing the capacitance of the capacitors C1 and C2. Accordingly, a standby current is not consumed while increasing the slew rate, and power consumption of a device is reduced. The threshold level may be predetermined.

Further, a configuration of the circuit to be added for this operation is simple and occupies a relatively small area. Thus, it is advantageous in the miniaturization of the device.

An operational amplifying circuit according to another exemplary embodiment will be described with reference to FIG. 6.

Figure 6:
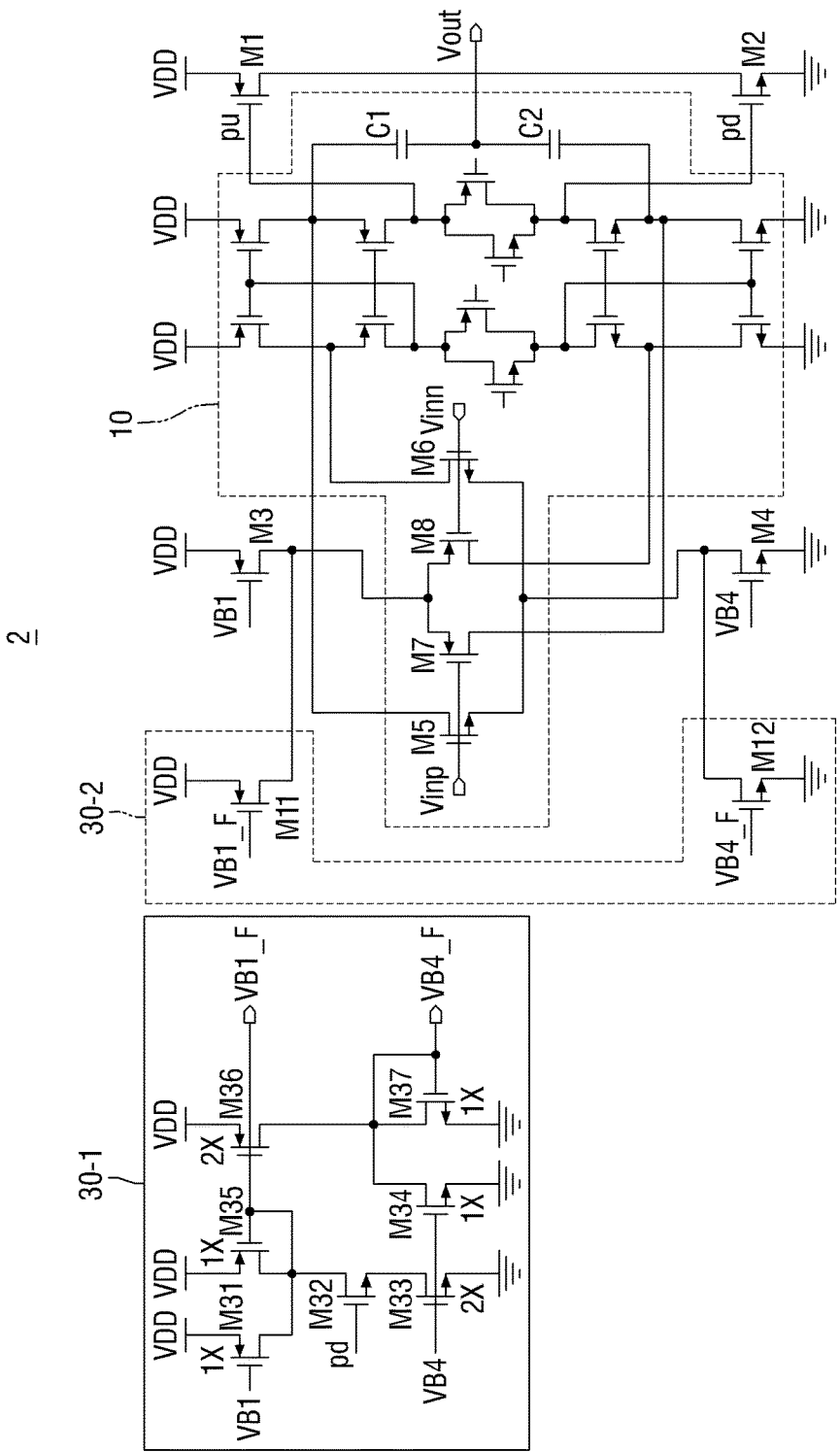
FIG. 6 is a circuit diagram of an operational amplifying circuit according to another exemplary embodiment.

FIG. 6 is a circuit diagram of an operational amplifying circuit according to another exemplary embodiment. The same description as the exemplary embodiment described above will be omitted, and differences will be mainly described.

Referring to FIG. 6, an operational amplifying circuit 2 may include the control circuit 10, the pull-up transistor M1, the pull-down transistor M2, the first bias circuit M3 and M4, a bias voltage generating circuit 30-1, and a second bias circuit 30-2.

The bias voltage generating circuit 30-1 may generate a third bias voltage VB1_F and a fourth bias voltage VB4_F which are different from each other. The bias voltage generating circuit 30-1 may generate the third and fourth bias voltages VB1_F and VB4_F when the voltage level of the pull-down node pd reaches a threshold voltage level (e.g., SDL of FIG. 7). The bias voltage generating circuit 30-1 may generate the third and fourth bias voltages VB1_F and VB4_F when the voltage level of the pull-up node pu is greater than the threshold voltage level. The threshold voltage level may be predetermined.

The bias voltage generating circuit 30-1 may include a transistor M32 which is gated to the voltage level of the pull-down node pd and turned on when the voltage level of the pull-down node pd reaches a threshold voltage level (e.g., SDL of FIG. 7), a transistor M31 which is gated to the first control voltage VB1 to provide the power supply voltage VDD to the transistor M32, and a transistor M33 which is gated to the second control voltage VB4 to connect the transistor M32 to the ground voltage. The threshold voltage level may be predetermined.

Further, the bias voltage generating circuit 30-1 may include a transistor M35 which is gated to the third bias voltage VB1_F to provide the power supply voltage VDD to the transistor M32, a transistor M34 which is gated to the second control voltage VB4 to generate a bias current, a transistor M37 which is gated to the fourth bias voltage VB4_F to connect the transistor M34 to the ground voltage, and a transistor M36 which is gated to the third bias voltage VB1_F to provide the power supply voltage VDD to the transistor M34.

In some exemplary embodiments, the size of the transistors M33 and M36 (for example, measured in nanometers (nm)) may be different from the size of the transistors M31, M34, M35 and M37. Specifically, the size of the transistors M33 and M36 may be greater than the size of the transistors M31, M34, M35 and M37. More specifically, the size of the transistors M33 and M36 may be twice the size of the transistors M31, M34, M35 and M37.

In some exemplary embodiments, the transistors M31, M35 and M36 may include, e.g., PMOS transistors, and the transistors M32, M33, M34 and M37 may include, e.g., NMOS transistors, but the inventive concept is not limited thereto.

The second bias circuit 30-2 may receive the third and fourth bias voltages VB1_F and VB4_F generated from the bias voltage generating circuit 30-1 and provide a second bias current to the control circuit 10.

In some exemplary embodiments, the amplitude of the second bias current provided to the control circuit 10 from the second bias circuit 30-2 may be smaller than the amplitude of the first bias current provided to the control circuit 10 from the first bias circuit M3 and M4. However, the inventive concept is not limited thereto, and may be modified.

The second bias circuit 30-2 may include a transistor M11 which is gated to the third bias voltage VB1_F to provide the power supply voltage VDD to the control circuit 10, and a transistor M12 which is gated to the fourth bias voltage VB4_F to connect the ground voltage to the control circuit 10.

Specifically, a drain of the transistor M11 may be connected to the drain of the transistor M3 and the sources of the transistors M7 and M8 of the control circuit 10, and a drain of the transistor M12 may be connected to the drain of the transistor M4 and the sources of the transistors M5 and M6 of the control circuit 10.

In some exemplary embodiments, the transistor M11 may include, e.g., a PMOS transistor, and the transistor M12 may include, e.g., an NMOS transistor, but the inventive concept is not limited thereto.

Hereinafter, an operation of the operational amplifying circuit according to another exemplary embodiment will be described with reference to FIGS. 6 and 7.

Figure 7:
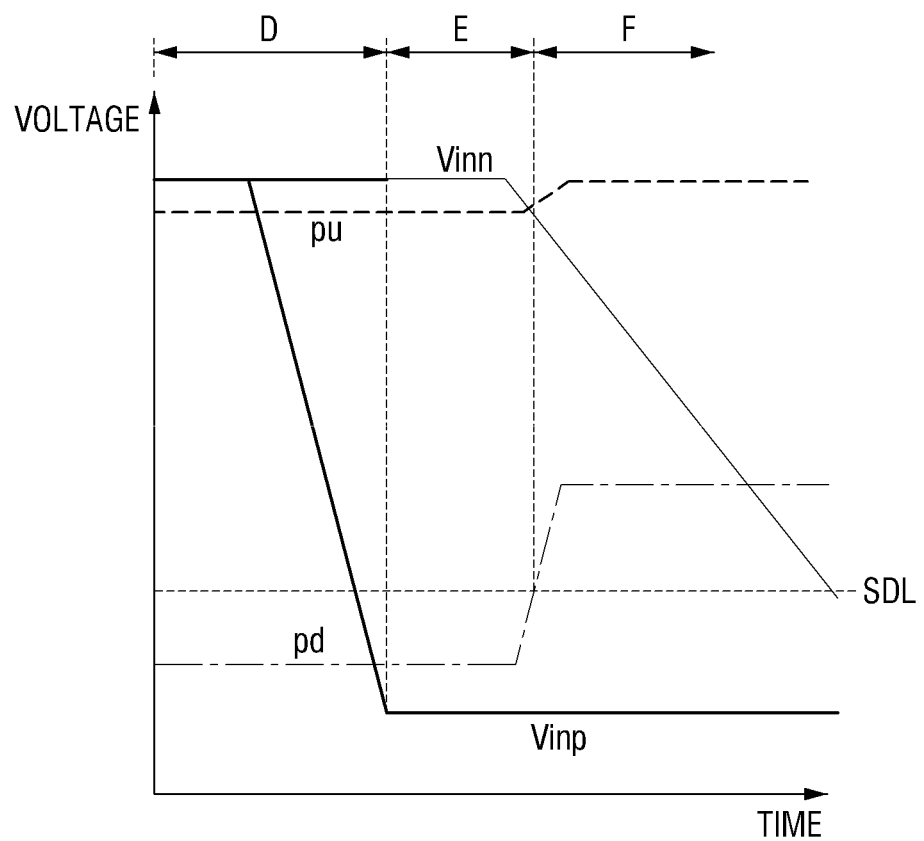
FIG. 7 is an operation diagram of the operational amplifying circuit of FIG. 6.

FIG. 7 is an operation diagram of the operational amplifying circuit of FIG. 6.

Referring to FIG. 7, the input voltage inputted to the first input terminal Vinp transitions to the second level L (section D). Accordingly, the transistor M7 is turned on and the transistor M5 is turned off. On the other hand, since the level of the input voltage inputted to the first input terminal Vinp has not been delivered to the output terminal Vout, the second input terminal Vinn is maintained at the first level H. Accordingly, the transistor M6 is turned on, and the transistor M8 is turned off.

Then, according to the operation of the control circuit 10, the voltage of the pull-down node pd transitions from the second level L to the first level H (section E).

Since it can be easily inferred by those skilled in the art that the voltage level of the pull-down node pd transitions from the second level L to the first level H according to the operation of the control circuit 10, a detailed description thereof will be omitted.

If the voltage level of the pull-down node pd is increased or does not reach the threshold voltage level SDL, the transistor M32 included in the bias voltage generating circuit 30-1 is not turned on. Accordingly, the voltage level of the fourth bias voltage VB4_F is maintained at the second level L. Since the transistor M37 gated to the fourth bias voltage VB4_F is in the turned-off state, the voltage level of the third bias voltage VB1_F is maintained at the first level H. The threshold voltage level SDL may be predetermined.

Thus, both the transistors M11 and M12 included in the second bias circuit 30-2 are maintained in the turn-off state.

Then, according to the operation of the control circuit 10, the voltage level of the pull-down node pd transitions to a level greater than the threshold voltage level SDL (section F).

Accordingly, the transistor M32 included in the bias voltage generating circuit 30-1 is turned on. Accordingly, the fourth bias voltage VB4_F also transitions to the first level H. Since the transistor M37 gated to the fourth bias voltage VB4_F is turned on, the third bias voltage VB1_F transitions to the second level L.

Accordingly, both the transistors M11 and M12 included in the second bias circuit 30-2 are turned on, and the second bias current is provided to the control circuit 10.

The operational amplifying circuit 1 according to the above-described exemplary embodiment is a circuit for improving rising slew rate characteristics, whereas the operational amplifying circuit 2 according to the present exemplary embodiment can improve falling slew rate characteristics.

Also in the operational amplifying circuit 2 according to the present exemplary embodiment, an additional bias current is provided to the control circuit 10 by detecting a time point when the voltage level of the pull-down node pd becomes greater than a threshold level without decreasing the capacitance of the capacitors C1 and C2. Accordingly, a standby current is not consumed while increasing the slew rate, and power consumption of a device is reduced. The threshold level may be predetermined.

An operational amplifying circuit according to still another exemplary embodiment will be described with reference to FIG. 8.

Figure 8:
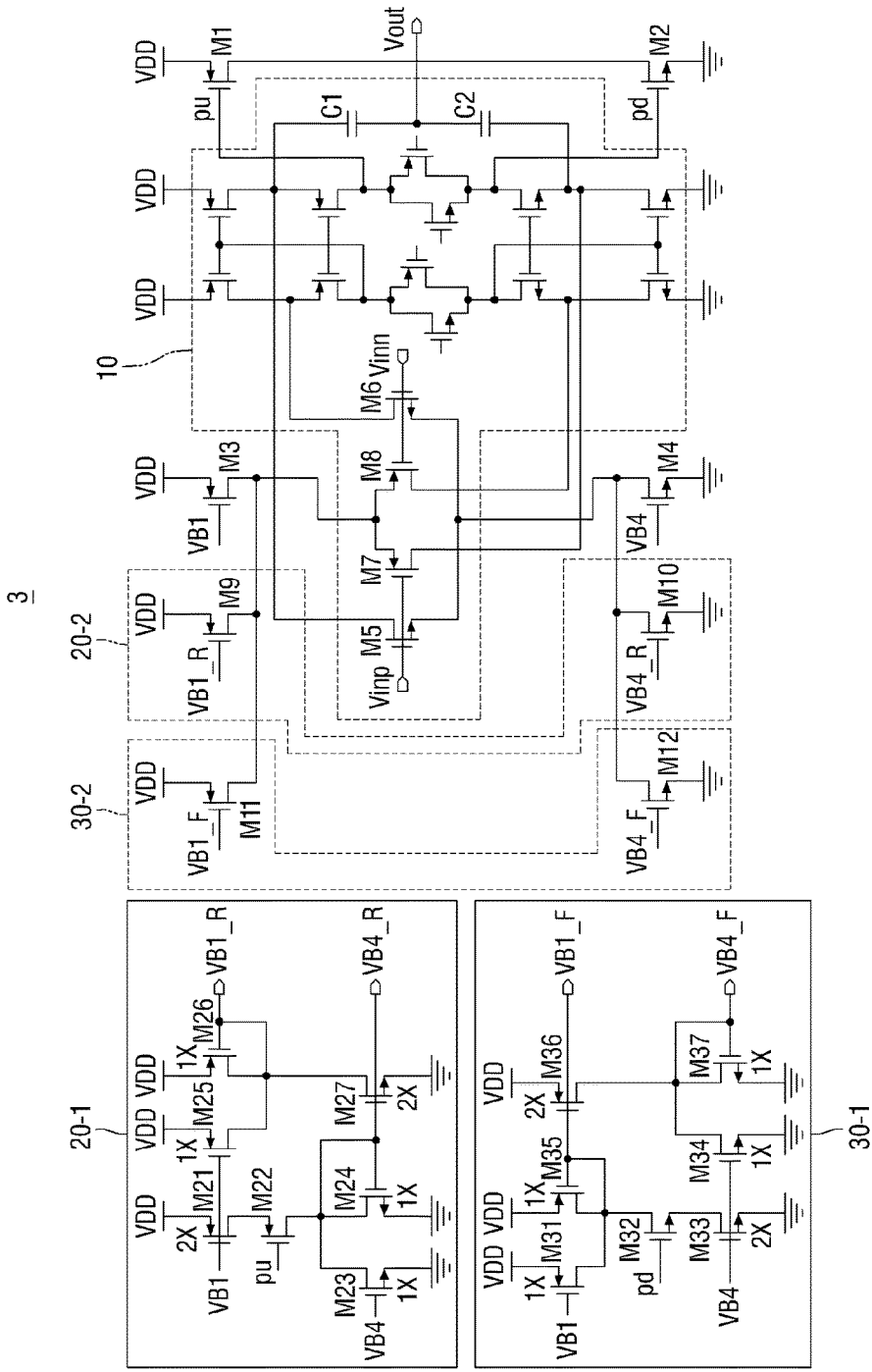
FIG. 8 is a circuit diagram of an operational amplifying circuit according to still another exemplary embodiment.

FIG. 8 is a circuit diagram of an operational amplifying circuit according to still another exemplary embodiment. Similarly, differences from the above-described exemplary embodiments will be mainly described.

Referring to FIG. 8, an operational amplifying circuit 3 may include the control circuit 10, the pull-up transistor M1, the pull-down transistor M2, the first bias circuit M3 and M4, the bias voltage generating circuits 20-1 and 30-1, and the second bias circuits 20-2 and 30-2.

The bias voltage generating circuit 20-1 may generate a first bias voltage VB1_R and a second bias voltage VB4_R which are different from each other. The bias voltage generating circuit 20-1 may generate the first and second bias voltages VB1_R and VB4_R when the voltage level of the pull-up node pu reaches a threshold voltage level (e.g., SDL of FIG. 3). For example, the bias voltage generating circuit 20-1 may generate the first and second bias voltages VB1_R and VB4_R when the voltage level of the pull-up node pu is less than or equal to the threshold voltage level. The threshold level may be predetermined.

The bias voltage generating circuit 30-1 may generate a third bias voltage VB1_F and a fourth bias voltage VB4_F which are different from each other. The bias voltage generating circuit 30-1 may generate the third and fourth bias voltages VB1_F and VB4_F when the voltage level of the pull-down node pd reaches a threshold voltage level (e.g., SDL of FIG. 7). For example, the bias voltage generating circuit 30-1 may generate the third and fourth bias voltage VB1_F and VB4_F when the voltage level of the pull-up node pu is greater than the threshold voltage level. The threshold voltage level may be predetermined.

The second bias circuit 20-2 may receive the first and second bias voltages VB1_R and VB4_R generated from the bias voltage generating circuit 20-1 and provide a second bias current to the control circuit 10.

The second bias circuit 30-2 may receive the third and fourth bias voltages VB1_F and VB4_F generated from the bias voltage generating circuit 30-1 and provide a second bias current to the control circuit 10.

The operational amplifying circuit 3 according to the present exemplary embodiment can improve both rising slew rate characteristics and falling slew rate characteristics.

Next, a display device employing an operational amplifier circuit according to exemplary embodiments will be described with reference to FIGS. 9 and 10.

Figure 9:
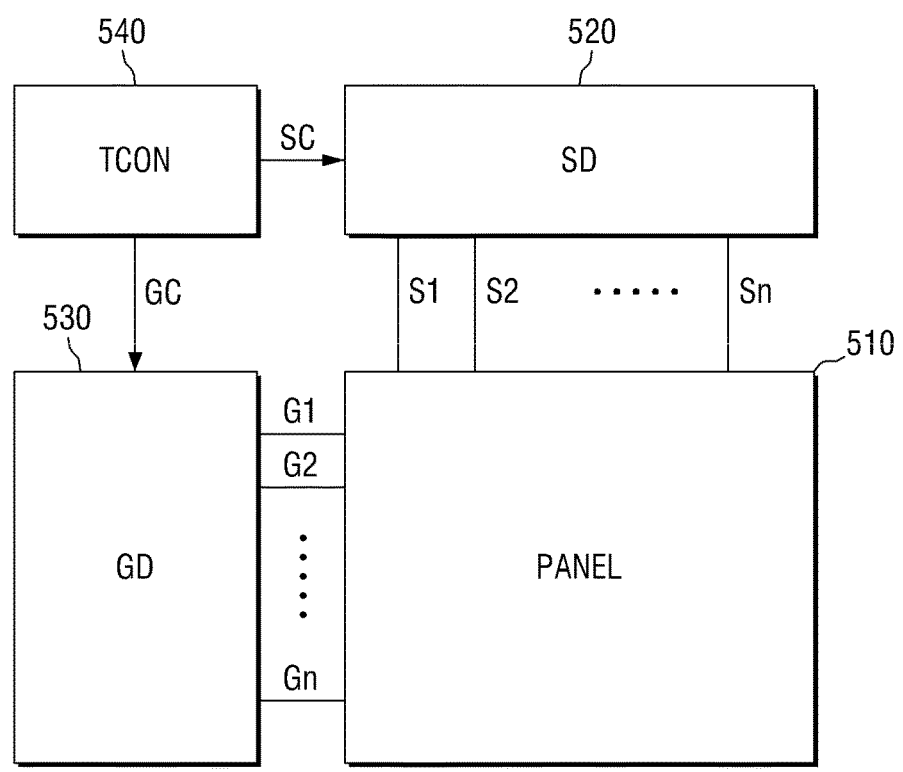
FIG. 9 is a block diagram showing a configuration of a display device employing an operational amplifier circuit according to exemplary embodiments.

FIG. 9 is a block diagram showing a configuration of a display device employing an operational amplifier circuit according to exemplary embodiments. FIG. 10 is a block diagram showing a source driver shown in FIG. 9.

Referring to FIG. 9, a display device 500 may include a panel (PANEL) 510, a source driver (SD) 520, a gate driver (GD) 530 and a timing controller (TCON) 540.

The panel 510 may include a plurality of pixels. In the panel 510, a plurality of gate lines G1~Gn and a plurality of source lines S1~Sn may be disposed in a matrix to intersect each other, and pixels may be defined at the intersections. For example, each pixel may be constituted by a plurality of dots (e.g., RGB).

The timing controller 540 may control the source driver 520 and the gate driver 530. The timing controller 540 may receive a plurality of control signals and data signals from an external system. The timing controller 540 may generate a gate control signal GC and a source control signal SC in response to the received control signals and data signals, and output the gate control signal GC to the gate driver 530 and output the source control signal SC to the source driver 520.

In response to the gate control signal GC, the gate driver 530 may supply a gate drive signal sequentially to the panel 510 through the gate lines G1~Gn. Further, whenever the gate lines G1~Gn are sequentially selected, the source driver 520 may supply image data to the source lines S1~Sn in response to the source control signal SC. The image data may be predetermined.

Figure 10:
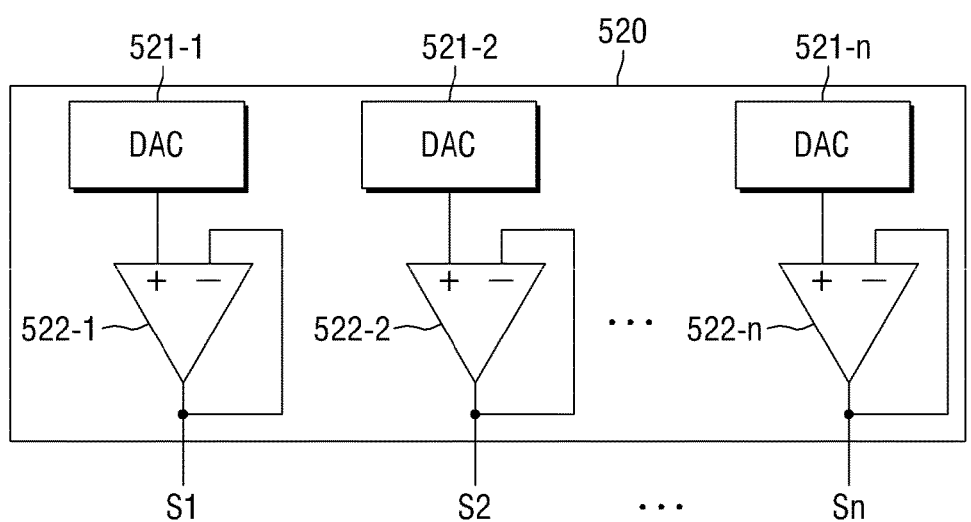
FIG. 10 is a block diagram showing a source driver shown in FIG. 9.

Referring to FIG. 10, the source driver (SD) 520 may include a plurality of operational amplifiers 522-1~522-n, and a plurality of digital-to-analog converters (DACs) 521-1~521-n.

For example, the digital-to-analog converters 521-1~521-n may be provided with image data including digital signals and convert the image data into analog signals.

The digital-to-analog converters 521-1~521-n may be connected to the operational amplifiers 522-1~522-n. Specifically, the digital-to-analog converters 521-1~521-n may be connected to the first input terminals Vinp (see FIG. 1) of the operational amplifiers 522-1~522-n, respectively. That is, each of the digital-to-analog converters 521-1~521-n may be connected to a first input terminal Vinp of a respective one of the operational amplifiers 522-1~522-n.

The output terminals Vout (see FIG. 1) of the operational amplifiers 522-1~522-n may be connected to the source lines S1~Sn, respectively.

In this case, the operational amplifiers 522-1~522-n may employ the operational amplifying circuits 1 to 3 according to the above-described exemplary embodiments.

Figure 11:
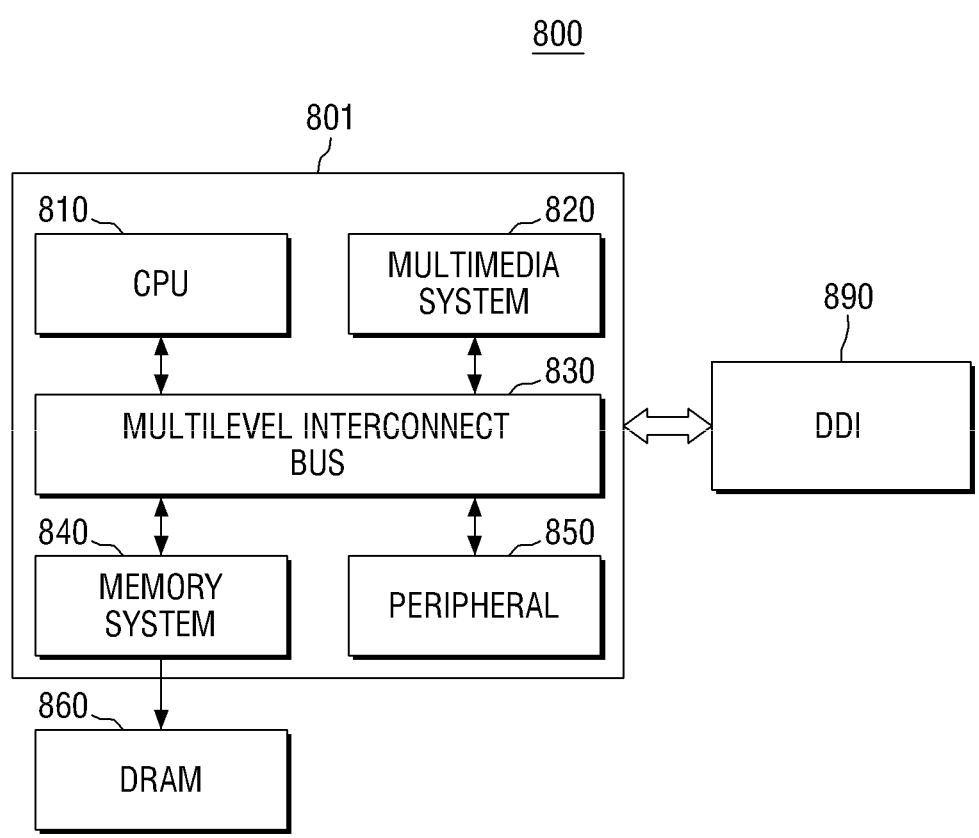
FIG. 11 is a block diagram of an System on Chip (SoC) system employing an operational amplifying circuit according to exemplary embodiments.

FIG. 11 is a block diagram of an SoC system employing the operational amplifying circuit according to exemplary embodiments.

Referring to FIG. 11, an SoC system 800 includes an application processor 801, a DRAM 860 and a DDI 890.

The application processor 801 may include a central processing unit (CPU) 810, a multimedia system 820, a bus 830, a memory system 840, and a peripheral circuit 850.

The central processing unit 810 may execute operations for operating the SoC system 800. In some exemplary embodiments, the central processing unit 810 may execute operations in a multi-core environment including a plurality of cores.

The multimedia system 820 may be used to perform various multimedia functions in the SoC system 800. The multimedia system 820 may include a 3D engine module, a video codec, a display system, a camera system, a post-processor and the like. In some exemplary embodiments, the multimedia system 820 may generate digital image data to be provided to the DDI 890, and the digital image data may be provided to, e.g., the digital-to-analog converters 521-1~521-n (see FIG. 10) of the source driver 520 (see FIG. 10) included in the DDI 890.

The bus 830 may be used in data communication between the central processing unit 810, the multimedia system 820, the memory system 840 and the peripheral circuit 850. In some exemplary embodiments, the bus 830 may have a multi-layer structure. Specifically, as an example of the bus 830, a multi-layer Advanced High-performance Bus (AHB), or a multi-layer Advanced eXtensible Interface (AXI) may be used, but the inventive concept is not limited thereto.

The memory system 840 may provide an environment for the application processor 801 to be connected to an external memory (e.g., DRAM 860) and perform a high-speed operation. In some exemplary embodiments, the memory system 840 may include a separate controller (e.g., DRAM controller) for controlling the external memory (e.g., DRAM 860).

The peripheral circuit 850 may provide an environment necessary for the SoC system 800 to be smoothly connected to an external device (e.g., a main board). Accordingly, the peripheral circuit 850 may include a variety of interfaces to be compatible with an external device connected to the SoC system 800.

The DRAM 860 may function as an operation memory for the application processor 801 to operate. In some exemplary embodiments, the DRAM 860 may be disposed on the outside of the application processor 801 as illustrated. Specifically, the DRAM 860 and the application processor 801 may be packaged in the form of Package on Package (PoP). In other exemplary embodiments, the DRAM 860 may be disposed in the application processor 801.

Figure 12:
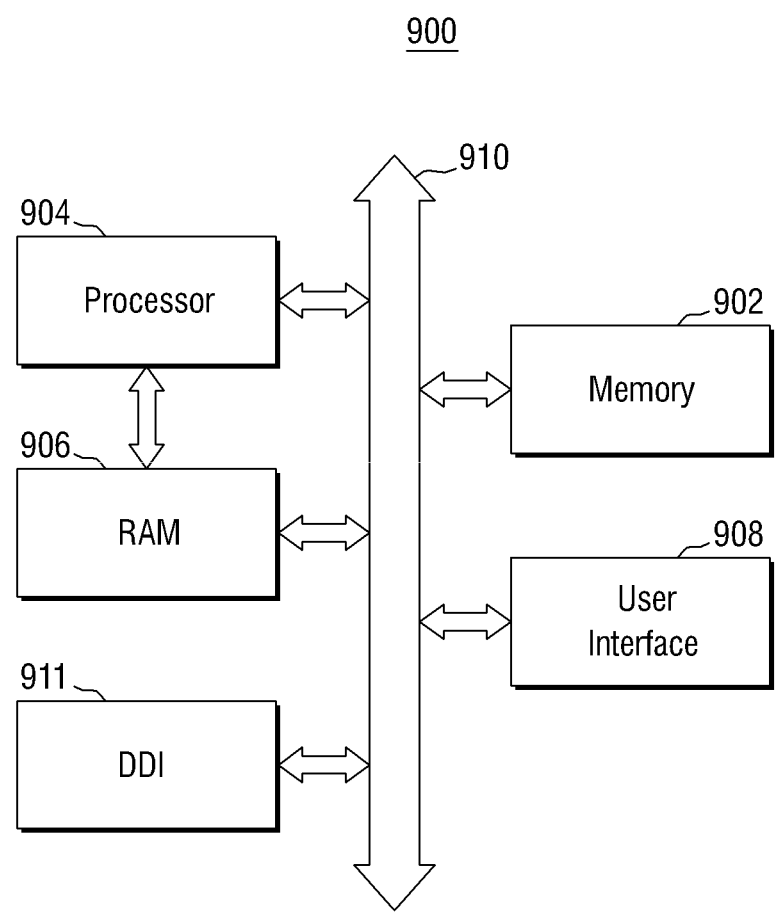
FIG. 12 is a block diagram showing a configuration of an electronic system in which the operational amplifying circuit according to exemplary embodiments is employed.

FIG. 12 is a block diagram showing a configuration of an electronic system in which the operational amplifying circuit according to exemplary embodiments is employed.

Referring to FIG. 12, an electronic system 900 may include a memory system 902, a processor 904, a RAM 906, a user interface 908, and a DDI 911.

The memory system 902, the processor 904, the RAM 906, the user interface 908, the communication system 912 and the DDI 911 may perform data communication with each other using a bus 910.

The processor 904 may serve to execute a program and control the electronic system 900. The processor 904 may include at least one of micro-processor, a digital signal processor, a micro-controller and logic devices capable of performing functions similar to those thereof. The processor 904 may include a plurality of microprocessors.

The RAM 906 may be used as an operation memory of the processor 904. The RAM 906 may be formed of a volatile memory such as a DRAM. The processor 904 and the RAM 906 may be implemented to be packaged in one semiconductor device or semiconductor package.

The user interface 908 may be used to input/output data into/from the electronic system 900. As examples of the user interface 908, there are a keypad, a keyboard, an image sensor, a display device and the like. In particular, if the electronic system 900 is an image output system, an image to be outputted through an internal operation may be transmitted to a user by being outputted to the panel 510 (see FIG. 9) through the DDI 911.

The memory system 902 may store codes for operation of the processor 904, and data processed by the processor 904, or externally input data. The memory system 902 may include a separate controller for operation, and may be configured to additionally include an error correction block. The error correction block may be configured to detect and correct an error of data stored in the memory system 902 using an error correction code (ECC).

In an information processing system such as a mobile device and desktop computer, a flash memory may be mounted as the memory system 902. The flash memory may be configured in the form of a solid state drive (SSD). In this case, the electronic system 900 may reliably store a large capacity of data in the flash memory.

The memory system 902 may be integrated into a single semiconductor device. For example, the memory system 902 may be integrated into a single semiconductor device to form a memory card such as a PC card (personal computer memory card international association; PCMCIA), a compact flash card (CF), a smart media card (SM, SMC), a memory stick, a multimedia card (MMC, RS-MMC, MMC-micro), an SD card (SD, miniSD, microSD, SDHC), and a universal flash storage (UFS).

The DDI 911 may employ at least one of the operational amplifying circuits 1 to 3 according to the above-described exemplary embodiments.

Figure 13:
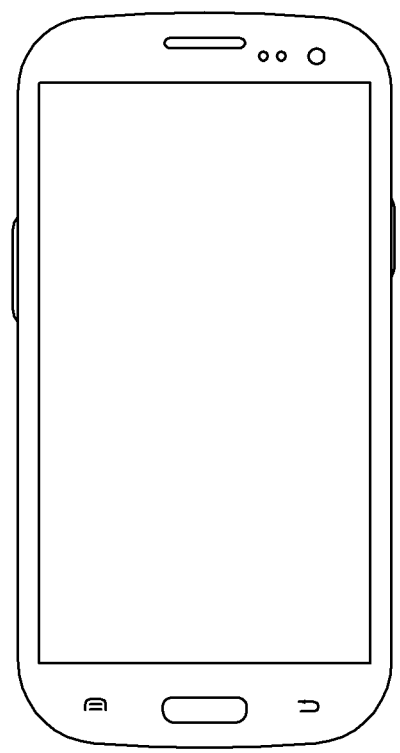
FIG. 13 is a diagram illustrating an example in which the electronic system of FIG. 12 is applied to a smart phone.

The electronic system 900 shown in FIG. 12 may be applied to an electronic control unit of a variety of electronic devices. FIG. 13 is a diagram illustrating an example in which the electronic system of FIG. 12 is applied to a smart phone 1000. In the case where the electronic system 900 (see FIG. 12) is applied to the smart phone 1000, some components of the electronic system 900 (see FIG. 12) may be implemented as an application processor.

Figure 14:
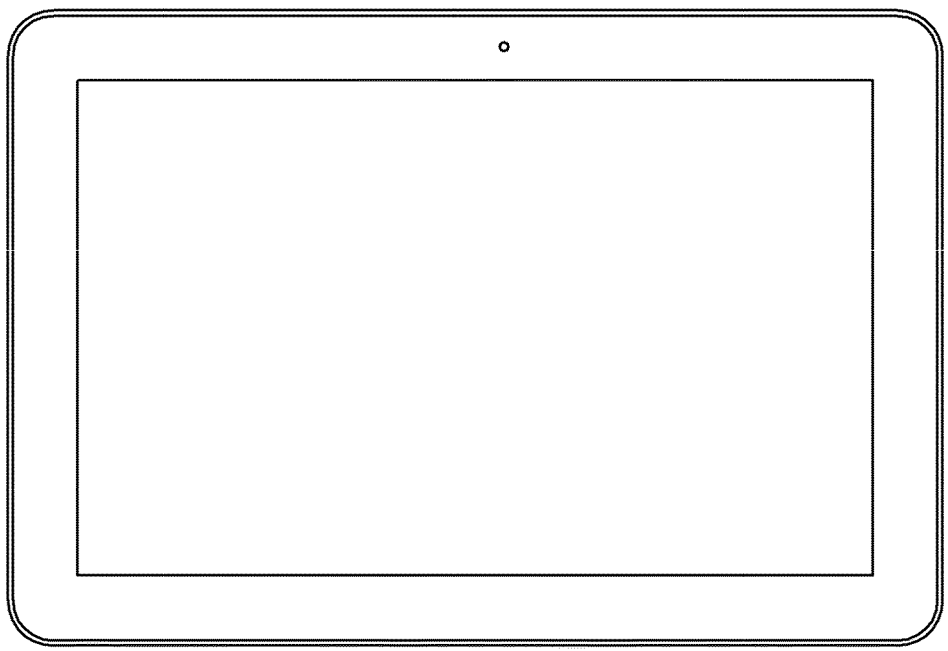
FIG. 14 shows an example in which the electronic system of FIG. 12 is applied to a tablet PC.
Figure 15:
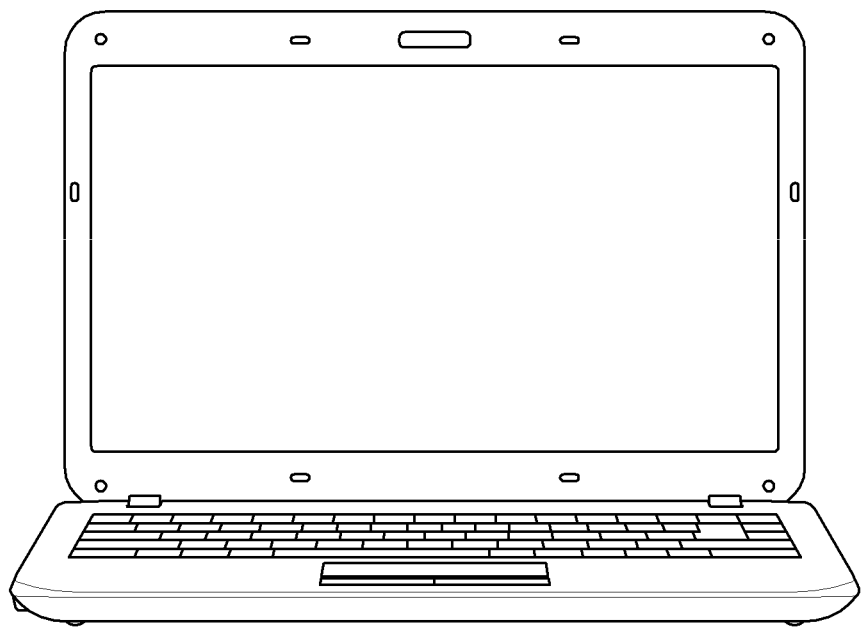
FIG. 15 shows an example in which the electronic system of FIG. 12 is applied to a laptop.

The electronic system 900 (see FIG. 12) may be employed in other electronic devices. FIG. 14 shows an example in which the electronic system 900 of FIG. 12 is applied to a tablet PC 1100. FIG. 15 shows an example in which the electronic system 900 of FIG. 12 is applied to a laptop 1200.

The electronic system 900 (see FIG. 12) may be provided as one of various components of an electronic device such as a personal computer, a ultra mobile personal computer (UMPC), a workstation, a net-book, a personal digital assistant (PDA), a portable computer (PC), a web tablet, a wireless phone, a mobile phone, an e-book, a portable multimedia player (PMP), a portable game console, a navigation device, a black box, a digital camera, a three-dimensional television, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

In the case where the electronic system 900 (see FIG. 12) is an apparatus which can perform wireless communication, the electronic system 900 (see FIG. 12) may be used in a communication system such as Code Division Multiple Access (CDMA), Global System for Mobile communication (GSM), North American Digital Cellular (NADC), Enhanced-Time Division Multiple Access (E-TDMA), Wideband Code Division Multiple Access (WCDAM), and CDMA2000.

Those skilled in the art will appreciate that many variations and modifications can be made to the exemplary embodiments without substantially departing from the principles of the present inventive concept. Therefore, the disclosed exemplary embodiments are used in a generic and descriptive sense only and not for purposes of limitation.

What is claimed is:

1. An operational amplifying circuit comprising:
    a control circuit comprising a first input terminal configured to receive an input voltage, a second input terminal and an output terminal connected to the second input terminal, the control circuit being configured to, in response to the input voltage transitioning to a first level, change a voltage level of a pull-up node and a voltage level of a pull-down node to a second level that is different from the first level;
    a pull-up transistor gated to the voltage level of the pull-up node to provide a power supply voltage to the output terminal;
    a pull-down transistor gated to the voltage level of the pull-down node to connect the output terminal to a ground voltage;
    a first bias circuit configured to provide a first bias current to the control circuit;
    a bias voltage generating circuit configured to generate a bias voltage in response to the voltage level of at least one of the pull-up node and the pull-down node reaching a threshold voltage level; and
    a second bias circuit gated to the generated bias voltage to provide a second bias current to the control circuit.

2. The operational amplifying circuit of claim 1, wherein the second bias current is smaller than the first bias current.

3. The operational amplifying circuit of claim 1, wherein the first level is a logical high level, the second level is a logical low level, and the bias voltage generating circuit is configured to generate a bias voltage in response to the voltage level of the pull-up node reaching the threshold voltage level.

4. The operational amplifying circuit of claim 1, wherein the first level is a logical low level, the second level is a logical high level, and the bias voltage generating circuit is configured to generate a bias voltage in response to the voltage level of the pull-down node reaching the threshold voltage level.

5. The operational amplifying circuit of claim 1, wherein the bias voltage generating circuit comprises a turn-on transistor which is configured to be turned on in response to the voltage level of at least one of the pull-up node and the pull-down node reaching the threshold voltage level.

6. The operational amplifying circuit of claim 5, wherein the turn-on transistor comprises a PMOS transistor which is configured to be turned on in response to the voltage level of the pull-up node reaching the threshold voltage level.

7. The operational amplifying circuit of claim 5, wherein the turn-on transistor comprises an NMOS transistor which is configured to be turned on in response to the voltage level of the pull-down node reaching the threshold voltage level.

8. The operational amplifying circuit of claim 5, wherein the bias voltage generating circuit is configured to generate a first bias voltage which transitions to the second level and a second bias voltage which transitions to the first level in response to the turn-on transistor being turned on.

9. The operational amplifying circuit of claim 8, wherein the second bias circuit comprises a PMOS transistor which is gated to the first bias voltage to provide a power supply voltage to the control circuit, and an NMOS transistor which is gated to the second bias voltage to connect the control circuit to a ground voltage.

10. An operational amplifying circuit comprising:
    a control circuit comprising a first input terminal configured to receive an input voltage, a second input terminal and an output terminal connected to the second input terminal, the control circuit being configured to, in response to the input voltage transitioning to a first level, change a voltage level of a pull-up node and a voltage level of a pull-down node to a second level that is different from the first level;
    a pull-up transistor gated to the voltage level of the pull-up node to provide a power supply voltage to the output terminal;
    a pull-down transistor gated to the voltage level of the pull-down node to connect the output terminal to a ground voltage;
    a first bias circuit configured to provide a first bias current to the control circuit; and
    a second bias circuit configured to generate a first bias voltage and a second bias voltage which are different from each other, in response to the voltage level of at least one of the pull-up node and the pull-down node reaching a threshold voltage level, and to provide a second bias current to the control circuit.

11. The operational amplifying circuit of claim 10, wherein the first level comprises a logical high level, the second level includes a logical low level, and the second bias circuit generates the first and second bias voltages when the voltage level of the pull-up node reaches the threshold voltage level.

12. The operational amplifying circuit of claim 11, wherein the second bias circuit comprises a turn-on transistor which is turned on in response to the voltage level of the pull-up node reaching the threshold voltage level.

13. The operational amplifying circuit of claim 10, wherein the first level is a logical low level, the second level is a logical high level, and the second bias circuit is configured to generate the first and second bias voltages in response to the voltage level of the pull-down node reaching the threshold voltage level.

14. The operational amplifying circuit of claim 13, wherein the second bias circuit comprises a turn-on transistor which is configured to be turned on in response to the voltage level of the pull-down node reaching the threshold voltage level.

15. The operational amplifying circuit of claim 10, wherein the second bias current is smaller than the first bias current.

16. An operational amplifying circuit comprising:
    a first input terminal;
    an output terminal;
    a second input terminal electrically connected to the output terminal;
    an amplification circuit that is electrically connected to the first input terminal, the second input terminal, and the output terminal, the amplification circuit comprising a node and being configured to amplify an input signal input at the first input terminal and output the amplified signal at the output terminal;

a first bias circuit configured to provide a first bias current for driving the amplification circuit; and a second bias circuit configured to provide a second bias current for driving the amplification circuit in response to a voltage level at the node crossing a threshold voltage level.

17. The operational amplifying circuit according to claim 16, wherein the node is a pull-up node, and the second bias circuit is configured to provide the second bias current to the amplification circuit in response to the voltage level at the pull-up node being less than or equal to the threshold voltage level.

18. The operational amplifying circuit according to claim 16, wherein the node is a pull-down node, and the second bias circuit is configured to provide the second bias current to the amplification circuit in response to the voltage level at the pull-down node being greater than the threshold voltage level.

19. The operational amplifier circuit according to claim 16, wherein the node is a pull-up node, and the second bias circuit is configured to provide the second bias current to the amplification circuit in response to the voltage level at the pull-up node being less than or equal to the threshold voltage level, wherein the amplification circuit further comprises a pull-down node, wherein the second bias circuit is configured to provide a third bias current to the amplification circuit in response to a voltage level at the pull-down node being greater than the threshold voltage level.

20. The operational amplifier circuit according to claim 16, wherein the amplification circuit comprises a plurality of capacitors electrically connected to the output terminal.

* * * * *